United States Patent [19]

Stephani et al.

[11] Patent Number: 4,929,534

[45] Date of Patent: May 29, 1990

[54] POSITIVE-WORKING PHOTOSENSITIVE MIXTURE AND PHOTOLITHOGRAPHIC COPYING MATERIAL PRODUCED THEREFROM WITH O-QUINONE DIALIDE SULFONYL ESTER AND AZO COUPLER

[75] Inventors: Trutz-Ulrich Stephani, Erding; Dieter Mohr, Budenheim; Britta Maisel, Bischofsheim; Werner Frass, Wiesbaden, all of Fed. Rep. of Germany

[73] Assignee: Hoechst Aktiengesellschaft, Frankfurt am/Main, Fed. Rep. of Germany

[21] Appl. No.: 236,916

[22] Filed: Aug. 26, 1988

[30] Foreign Application Priority Data

Aug. 31, 1987 [DE] Fed. Rep. of Germany ....... 3729035

[51] Int. Cl.$^5$ .................... G03C 1/60; G03C 1/58; G03C 1/54
[52] U.S. Cl. .................................. 430/191; 430/173; 430/175; 430/182; 430/192; 430/193; 430/165; 430/302; 430/326
[58] Field of Search ............... 430/191, 192, 182, 173, 430/175, 193, 165

[56] References Cited

U.S. PATENT DOCUMENTS

| | | | |
|---|---|---|---|
| 2,774,669 | 12/1956 | Marron et al. | 430/191 |
| 2,974,042 | 3/1961 | Sus et al. | 430/191 |
| 3,086,861 | 4/1963 | Woitach et al. | 430/191 |
| 3,106,465 | 10/1963 | Neugebauer et al. | 96/33 |
| 3,149,972 | 9/1964 | Herrick et al. | 430/182 |
| 3,180,733 | 4/1965 | Neugebauer et al. | 96/33 |
| 3,615,537 | 10/1971 | Giesen et al. | 430/182 |
| 3,634,082 | 1/1972 | Christensen | 96/33 |
| 3,635,709 | 1/1972 | Kobayashi | 96/33 |
| 3,640,992 | 2/1972 | Sus et al. | 260/141 |
| 3,778,274 | 12/1973 | Inoue et al. | 430/191 |
| 3,869,292 | 3/1975 | Peters | 96/115 R |
| 3,890,152 | 6/1975 | Ruckert et al. | 430/175 |
| 3,929,488 | 12/1975 | Smith | 430/191 |
| 4,266,000 | 5/1981 | Stahlhofen et al. | 430/192 |
| 4,266,001 | 5/1981 | Buhr et al. | 430/192 |
| 4,275,139 | 6/1981 | Stahlhofen | 430/191 |
| 4,446,218 | 5/1984 | Dhillon | 430/145 |
| 4,506,003 | 3/1985 | Ruckert et al. | 430/270 |
| 4,594,306 | 6/1986 | Stahlhofen et al. | 430/191 |
| 4,678,737 | 7/1987 | Schneller et al. | 430/270 |
| 4,743,524 | 5/1988 | Muller et al. | 430/182 |
| 4,797,346 | 1/1989 | Yamamoto et al. | 430/191 |

FOREIGN PATENT DOCUMENTS

| | | | |
|---|---|---|---|
| 935452 | 8/1963 | United Kingdom . | |
| 937121 | 9/1963 | United Kingdom . | |
| 937123 | 9/1963 | United Kingdom . | |
| 951929 | 3/1964 | United Kingdom . | |
| 937510 | 9/1967 | United Kingdom | 430/173 |
| 1154749 | 6/1969 | United Kingdom . | |

OTHER PUBLICATIONS

V. V. Ershov et al.; Quinone Diazides; 1981; pp. 113-197 Chapter 5, Reactions Of Quinoediazide Without Elimination Of Nitrogen.
M. S. Dinaburg; Photosensitive Diazo Compounds And Their Uses; 1967, pp. 96-117; "The Focal Press".
Jaromir Kosar; Light-Sensitive Systems; 1965; pp. 194-214 Chemistry and Application of Nonsilver Halide Photographic Process; and pp. 321 and 330; John Wiley & Sons, Inc.

Primary Examiner—Charles L. Bowers, Jr.
Attorney, Agent, or Firm—Foley & Lardner, Schwartz, Jeffery, Schwaab, Mack, Blumenthal & Evans

[57] ABSTRACT

A positive-working photosensitive mixture containing an o-quinone diazide and a binder is disclosed wherein the mixture contains a compound which is able to form an azo coupling with the o-quinone diazide. A copying material produced with the photosensitive mixture has a high photosensitivity and an exceptional developer resistance. The photosensitive mixture is used in reproduction technique, and also in the field of resists.

7 Claims, No Drawings

POSITIVE-WORKING PHOTOSENSITIVE MIXTURE AND PHOTOLITHOGRAPHIC COPYING MATERIAL PRODUCED THEREFROM WITH O-QUINONE DIALIDE SULFONYL ESTER AND AZO COUPLER

BACKGROUND OF THE INVENTION

The present invention relates to a photosensitive mixture, a photolithographic copying material produced therefrom and a process for the preparation thereof. The photosensitive mixture contains an o-quinone diazide and a binder.

It is known that o-quinone diazides are used as photosensitive substances in the production of photocopies, photoresist materials and also in the photosensitive coatings of lithographic printing plates in addition to alkaline-soluble binders which are blended with the o-quinone diazides and/or are bound to the latter chemically.

The binders generally contain phenolic hydroxyl groups and are composed preferably of oligomeric compounds with molecular weights of less than 10,000 daltons. Preferred are novolaks, in particular cresol-/aldehyde condensation products or pyrogallol/acetone resins corresponding to U.S. Pat. No. 3,635,709. In addition, polyhydroxy styrene (DE-A-No. 2,322,230) and polymonomethacrylates of polyhydric phenols (DE-A-Nos. 3,528,929 and 3,528,930) are proposed as binders.

The higher the o-quinone diazide content in the mixture, the more insoluble the coating is in alkali. When the mixture is exposed to actinic radiation, the o-quinone diazide is converted into a carboxylic acid, as a result of which the alkali solubility of the coating increases. The difference in alkali solubility between exposed and unexposed regions of a photolithographic coating exposed to an image is required in order for it to be possible to develop the latter.

The content of o-quinone diazide in the mixture, however, also determines the photosensitivity of such a photolithographic mixture; and specifically, the lower the content, the higher is the expected photosensitivity. On the other hand, if the content of o-quinone diazide is too low, the difference in solubility between image areas and non-image areas is poor so that fine structures are increasingly lost in development owing to lack of differentiation.

In the two German Patents No. 875,437 and No. 893,748, positive-working photosensitive, water-insoluble diazo compounds which are applied to metallic bases to produce print forms are mixed with azo components. The azo dyestuffs produced after exposure to light are intended to make the adhesive base possible for the greasy printing ink on the printing form. In order to avoid the formation of azo dyestuffs on the areas on which light impinges, slow coupling diazo compounds are preferred. The photosensitive films do not contain a binder, and an increase in the light sensitivity as a result of the presence of coupling reagents is not observed.

In EP-A-No. 0,010,749, to improve the photosensitivity of a positive-working photosensitive mixture it is proposed to add a condensation product of a hydroxybenzophenone with formaldehyde to a mixture of an o-quinone diazide sulfonic acid ester or o-quinone diazide carboxylic acid ester or a carboxylic acid amide and an alkali-soluble and water-insoluble phenolic resin.

The disadvantage is, however, an excessively soft gradation.

SUMMARY OF THE INVENTION

It is therefore an object of the present invention to provide a positive-working photosensitive mixture exhibiting higher photosensitivity than systems known hitherto, in addition to having a good resolving power and a good developer resistance.

These and other objects are achieved by a photosensitive mixture comprising an o-quinone diazide, a binder, and a compound which can form an azo coupling with the o-quinone diazide.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Methylene-active compounds and/or aromatic and heteroaromatic compounds containing at least one substituent which promotes electrophilic substitution on the nucleus are able to form an azo coupling with a diazonium compound (hereinafter termed couplers). Hydroxyl groups are preferred as substituents which promote electrophilic substitution on the nucleus. Among the couplers, methylene-active compounds are preferably used. The couplers according to the invention preferably have a medium to high coupling rate.

In particular, couplers are preferred which are soluble both in the organic coating solution and also in the alkaline developer. The coupling product of the o-quinone diazide with the coupler has to be moderately soluble in the aqueous-alkaline developer so that, on the one hand, the coupled o-quinone diazide is actually able to go into solution to a sufficient extent in the exposed areas, but, on the other hand, the product cannot be washed out in the unexposed areas by the developer to such an extent that the resolving power and the developer resistance of the unexposed coating decrease substantially.

The coupling reaction between diazo compounds and coupling reagents is described in V. V. Ershov, G. A. Nikiforov and C. R. H. J. de Jonge, *Quinone Diazides*, Elsevier Scientific Publishing Company, Amsterdam-Oxford-New York, pages 114 ff. (1981).

A summary of the suitable coupling reagents is found in M. S. Dinaburg, *Photosensitive Diazo Compounds*, The Focal Press, London and New York, pages 96 ff. (1967).

Suitable methylene-active compounds to be used in accordance with the invention are compounds of the formula I

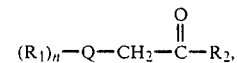

wherein  n = 1,  Q = carbonyl,  and
n = 0,  Q = cyano, $R_1$, $R_2$ are identical or different and denote alkyl, cyclo-alkyl, alkoxy, alkyl-, aryl- or acylamino, alkoxycarbonylamido, heteroaryl or heteroarylimino. Preferred are $(C_1-C_3)$alkyl, $(C_1-C_4)$alkoxy, $(C_1-C_4)$alkylamino, and $(C_6-C_{12})$arylamino.

It is particularly preferable that for $n=1$ and $Q=$ carbonyl $R_1$ is equal to methyl, and $R_2$ is preferably $(C_2-C_4)$alkylamino or $(C_6-C_{12})$arylamine, in particular, $C_6$-arylamino, it also being possible for the aryl radical to be substituted by $(C_1-C_3)$alkyl or $(C_1-C_3)$alkoxy, hydroxyl, halogen or aminocarbonyl, in particular by N-hydroxyalkylaminocarbonyl or aminosulfonyl.

$R_2$ may, however, also be a connecting link between two radicals of the formula

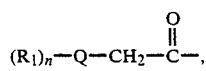

in which, for $n=1$ and $Q=$ carbonyl, $R_1$ is preferably methyl and $R_2$ denotes an aliphatic, cycloaliphatic or aromatic diamine, in particular, containing $(C_1-C_4)$alkyl or $(C_2-C_6)$cycloalkyl, a ring containing 2 nitrogen atoms as ring members and additionally 4 carbon atoms as ring carbon atoms being preferred. In the case of aromatic diamines, the meta position is preferred for the amino groups.

It is preferred in particular if $R_1$ and $R_2$ are connected to each other and form a cycloaliphatic radical which is composed of 5 or 6, in particular of 6, ring members and which is optionally substituted by alkyl, in particular by $(C_1-C_3)$alkyl or may optionally contain hetero atoms such as nitrogen, sulfur and oxygen, but also carbonyl groups, and in particular, forms an aminocarbonylamino.

It is less preferred if $n=0$ and $Q=$ cyano, in which case $R_2$ is preferably aryl, heteroaryl or heteroarylimino, alkoxycarbonylamido or alkylamino. In particular aryl radicals containing 6 to 10 carbon atoms and 5, 6, 9 or 10-membered, mono- to dicyclic heteroaryl radicals are preferred, such as, for example, benzofuranyl or benzothiofuranyl, in particular thioindoxyl or naphthyl, optionally substituted by alkyl, alkoxy or halogen, and also heteroarylimino radicals, in particular iminodihydroquinolinyl or iminohydrobenzothiazolyl, optionally also substituted by alkyl, alkoxy or halogen.

As methylene-active compounds, mention is made of aromatic and cycloaliphatic amides of acetoacetic acid, such as, for instance, anilides, in particular m-hydroxyanilide and o-chloroanilide, but also benzylanilide, p-aminosulfonylanilide, p-aminocarbonylanilide, in addition cyclohexylamides. There are also amides of diamino compounds, such as, for instance, of 1,2-diaminoethane, of diamino compounds of higher alkyl compounds inclusive of cycloaliphatic diamino compounds, such as, for instance piperazine. These also include diaminophenyl compounds, in particular m-diaminobenzene. Particularly preferred methylene-active compounds are acetylacetanilide, m-hydroxyacetylacetanilide, 4-acetylacetoamino-N-hydroxyethylbenzamide and m-bis-acetylacetaminobenzene.

In addition to the derivatives of acetoacetic acid, use is also made of derivatives of malonic acid, such as esters and amides thereof including the cyclic esters and amides which are closed to form a 5- or 6-membered ring. Particularly preferred among these is barbituric acid.

The representatives of the 1,3-dicarbonyl compounds include open-chain compounds containing a total of 1 to 8 carbon atoms, but also cyclic compounds, in particular those containing a total of 6 ring carbon atoms. Dimedone is preferred in this connection.

As a further group of the compounds included under the formula I, mention is made of the derivatives of cyanoacetic acid, mention being made in particular of the cyanoacetamides, such as cyanoacetanilide, cyanoaceturethane, cyanoaceturea, but also of amides of heterocyclics, such as, for instance, 2-(ω-cyanoacetylimino)-1-methyldihydroquinoline, 1-(ω-cyanoacetylimino)-2-methyl-6-ethoxydihydrobenzothiazole. The derivatives of cyano acetic acid also include esters and thioesters thereof, such as, for instance, 2-cyanoacetobenzofuran, 2-cyanoaceto-3-hydroxythionaphthene, but also cyanomethyl phenyl ketones.

The aromatic compounds according to the invention which carry at least one hydroxyl group include compounds of the formula II

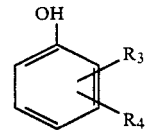

wherein $R_3, R_4$ are identical or different and denote hydrogen, alkyl, cycloalkyl, optionally aryl, heteroaryl, alkoxy, hydroxyl, ω-hydroxyalkoxy, aryl, acyl, amino, aminoalkyl and amidoacyl. Preferred, in particular, are $(C_1-C_3)$alkyl, preferably methyl, $(C_1-C_3)$alkoxy, hydroxyl, ω-hydroxy$(C_1-C_3)$alkoxy, aryl, preferably phenyl, which may be directly bound, but may also be linked via $(C_1-C_4)$alkylene, O, NH, S, SO or $SO_2$ and which may optionally be substituted by alkyl, alkoxy, halogen or preferably hydroxyl, only $R_3$, in particular, denoting aryl, while $R_4$ is hydroxyl, preferably in the meta position, Acid groups, such as carboxyl or sulfonyl and derivatives thereof such as carboxylamide and sulfonylamide, optionally substituted at the nitrogen by alkyl, aryl, hydroxyaryl or hydroxyl, preferably to N-hydroxyalkylamide, Amino such as $-NH_2$, $-NHR_5$ and $-NR_5R_6$, wherein $R_5$ and $R_6$ are identical or different and alkyl, in particular $(C_1-C_3)$alkyl, aryl, in particular phenyl, carboxyl, amidocarboxyl, carbonyl, oxocarboxyl esters, carboxyalkyl and also sulfonylalkyl.

It is particularly preferred if $R_3$ is equal to a hydroxyl group and the latter is in the meta position with respect to the first hydroxyl group, $R_4$ being equal to hydrogen or denoting amidocarboxyl which is substituted by hydroxyalkyl at the nitrogen and is preferably in the ortho or meta position to the hydroxyl group, $R_3$ and $R_4$ together form at least one aromatic carbocyclic system, preferably consisting in each case of six ring members, in particular a phenyl radical which is optionally substituted, preferably in position 5 and/or 8 thereof, by alkyl, in particular $(C_1-C_3)$alkyl, acyl, in particular sulfonyl, sulfonylamide, acylamino, in particular according to the formula $-NH-CO-R_7$, $R_7$ being alkyl, in particular $(C_1-C_{12})$alkyl, or aryl, in particular phenyl, which is optionally substituted, preferably in the meta position, by alkyl, halogen, nitro or sulfonylamide.

As compounds or compound classes, mention should particularly be made of:

Alkylphenols, including the ortho- and metacresols, 2,5,6-trimethylphenol, 2-hydroxymethylphenol, β-(2-hydroxyphenyl)propionic acid, 2-(ω-phenylaminomethyl)phenol, β-(4-methyl-2-hydroxyphenyl)glutaric acid, 2,5-dimethyl-6-(N-dimethylaminomethyl)phenol, dialkoxyphenols, for instance the 1,3-dimethyl ether of pyrogallol.

In addition, mention should be made of N-lauryl-p-aminophenol and N-acyl-m-aminophenols, for instance m-hydroxyacetanilide, N-hydroxyphenylthiourea and their analogs.

Some complex derivatives of alkylphenols are, for example, 2,5-dimethyl-4-morpholinomethylphenol, 2-methyl-5-isopropyl-4-morpholinoethylphenol and 2,5-dimethyl-4-dimethylaminomethylphenol and the derivatives substituted with alkyl radicals.

Equally suitable are derivatives of the hydroxybenzoic acids, preferably the amides, including the β-hydroxyethylamides, of 2,5-dimethyl-6-hydroxybenzoic acid, of 2-isopropyl-5-methyl-6-hydroxybenzoic acid, of 2-hydroxy-4-methylbenzoic acid and of salicylic acid.

Resorcin and derivatives thereof are preferably used. These include alkyl ethers thereof, for example the ethyl, methyl, β-hydroxyethyl-β-sulfoethyl, 4-sulfophenyl and the β-bromoethyl ethers, but also the monomethyl ethers of 4-morpholinomethylresorcin, of N,N-diethylaminoethylresorcin, of 3-hydroxyphenoxyacetic acid, and also the mono esters of resorcin, such as, for instance, monoacetates and monoaminoethyl carbonates.

Preferred are such derivatives of resorcin as, for example, 2,4-dehydroxybenzenesulfonic acid, in particular 2,4-dihydroxybenzene, carboxylic acids and derivatives thereof, in particular their amides and N-hydroxyalkylamides. In addition, use may also be made of 3,5-dihydroxybenzoic acid, 2,4,6-tribromo-3,5-dihydroxybenzoic acid, the N-hydroxyalkylamides of 2,4-dihydroxybenzoic acid, of 3,5-dihydroxybenzoic acid and of 4-methoxy-2-hydroxybenzoic acid.

Particularly preferred are resorcin, 2,4-dihydroxy-N-hydroxyethylbenzamide, 3,5-dihydroxy-N-hydroxyethylamide and resorcin monohydroxyethyl ether.

Compounds which are produced by forming an aromatic ring system via the radicals $R_5$ and $R_6$ are preferably derived from β-naphthol. Mention may be made by way of example of the sulfonic acids 1-naphthol-3-sulfonic acid, 1,8-dihydroxynaphthalene-4-sulfonic acid, 1,8-aminonaphthol-5-sulfonic acid, 1,8-benzoylaminonaphthol-2-sulfonic acid and 1,8-dihydroxynaphthalene-6-sulfonic acid, amides, anilides and esters thereof being preferred.

Suitable amides are, for instance, also N-β-hydroxyethylamide, N,N-bis-β-hydroxyethylamide, N-o-methoxyphenylamide, N-2,3'-dihydroxypropylamide, aminoalkylamides or dihydroxyarylamides.

According to the invention, use is likewise made of alkylamino- and acylaminonaphthols, among which mention may be made, by way of example, of: 1-(N-carbethoxymethylamino)-8-naphthol-4-sulfonic acid, 5-(p-nitro)benzamido-1-naphthol and 3'-aminobenzoylnaphthylamine.

As heterocyclic compounds used according to the invention, use is made of compounds of the formula III

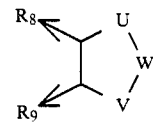

wherein

U,V,W are identical or different, but are preferably different and denote in each case one of the following different groups: Methylene, optionally substituted by alkyl, aryl, in particular phenyl, carboxyl, carboxylamide; carbonyl, carbonylimino, sulfur, selenium, oxygen, amino, imino, optionally substituted by alkyl or aryl, U and W, and optionally also V, preferably denoting amino or imino, or U preferably denoting oxygen, sulfur or selenium, V denoting sulfur or nitrogen and W denoting carbonyl, carbonylimino or methylene, or U denoting methylene, V denoting optionally substituted methylene and W denoting sulfur, U and W particularly preferably denoting amino or imino and V denoting carbonyl;

$R_8$ and $R_9$ are identical or different and denote hydrogen, alkyl, in particular $(C_1-C_{11})$alkyl, preferably $(C_1-C_3)$alkyl, hydroxyl or oxo, $R_8$ and $R_9$ form a carbocyclic, preferably aromatic, ring system composed of 6 to 10 ring atoms, in particular phenyl, optionally substituted by alkyl and/or hydroxyl. Particularly preferably $R_8$ is hydrogen, $R_9$ is $(C_1-C_3)$alkyl, V and W are amino or imino and U is carbonyl.

The following compounds or compound classes are preferred:

Derivatives of the imidazoles, thiazoles and selenazoles, for example hydroxynaphthimidazoles, 4-hydroxybenzimidazoles and 2-alkyl-substituted derivatives thereof, in particular the 2-methyl- or 2-propyl-4-hydroxybenzimidazoles, and also 6-hydroxy-1,3-benzoxathiol-2-one and 6-hydroxy-5-dimethylamino-1,3-benzoxathiolone.

In addition, according to the invention, use is made of hydroxybenzotriazoles, such as, for instance, 7-methyl-4-hydroxybenzotriazole, 1,7-dimethyl-4-hydroxybenzotriazole, 5,7-dihydroxy-N-methyl-benzotriazole, 5,6-dihydroxybenzotriazole.

Another group is formed by the thiophene class, for example 3-hydroxythiophene-5-carboxylic acid, 2-hydroxy-5-methylthiophene-4-carboxylic acid and their derivatives, preferably the methyl esters or dimethylamides.

Particularly preferred are pyrazolones. The derivatives include the compounds substituted in position 1 and/or 3 with alkyl, aryl or acyl, such as, for example, 1-phenyl-3-methyl-pyrazol-5-one a (3'-sulfonamido)-phenyl-3-methyl-pyrazol-5-one 1-[3'-(γ-hydroxypropyl)sulfonamido]phenyl-3-methyl-pyrazol-5one and 1-aryl-3-carboxypyrazolones. Preferably, those derivatives are used which do not carry any substituents in position 1 and have an alkyl radical, in particular $(C_1-C_3)$alkyl in position 3, such as, for example, 3-methyl-pyrazol-5-one.

The couplers mentioned may be contained either as mixtures with each other, but preferably individually, in the photosensitive mixture.

The equivalent ratio of coupler to o-quinone diazide compound is about 0.5 to 3, preferably about 0.8 to 2.

Suitable o-quinonediazide compounds are, in principle, all compounds of this structural type. Typical compounds are mentioned, for example, by Jaromir Kosar in *Light-Sensitive Systems*, John Wiley & Sons, Inc., New York, pp. 194 to 214 and pp. 321 to 330 (1965) and in DE-C-Nos. 938,233, 1,124,817, ',109,521, 1,120,273, 1,114,705 and 1,543,721 and also in DE-A-Nos. 2,742,631 and 2,828,037.

In particular, use is made of the sulfonic acid derivatives, preferably the esters, with aromatic hydroxyl compounds. The sulfonic acid group is, in general, in the 4 or 5 position of the naphthalene. As aromatic hydroxyl compounds, mention is made, in particular, of 2,4-dihydroxybenzophenone, 2,3,4-trihydroxybenzophenone, 4-(2-phenylprop-2-yl)phenol and pyrogallol.

Polymer-bound o-quinone diazides may likewise be used. Suitable polymers are condensation products of mono- and polyhydric phenols with aldehydes or acetone and polyvinylphenols. The molecular weight of the polymers is preferably about 800 to 8,000 daltons.

The quantity of the o-quinone diazide compounds in the photosensitive mixture is, in general, about 10% to 30%, and preferably about 15% to 25% by weight, based on the content of solids or of non-volatile constituents.

Furthermore, small quantities of radiation-sensitive components which preferably form or split off strong acids on exposure to light and produce a color change with a suitable dyestuff in a subsequent reaction may also be added to the photosensitive mixture to change the color after the exposure to light. Such radiation-sensitive components are, for example, 1,2-naphthoquinone-2-diazide-4-sulfonyl chloride, chromophorically substituted trihalomethyl-s-triazines or diazonium salts. Particularly preferred is 1,2-naphthoquinone-2-diazide-4-sulfonyl chloride.

To improve the film-forming properties, polymeric, water-insoluble binders which are both soluble in organic solvents and also soluble or at least swellable in aqueous-alkaline solutions are furthermore added to the photosensitive mixture. For instance, phenol/formaldehyde or cresol/formaldehyde resins, so-called novolaks, which may also be modified in a known manner by reaction with epoxides, isocyanates, etc., are suitable.

The film-forming phenolic resins preferably have a molecular weight of about 300 to 5,000 and are prepared by condensing phenol or substituted phenols with formaldehyde. Suitable substituted phenols are cresol, xylenol, butylphenol and the like. The particularly preferred alkali-soluble film-forming phenol resins are phenol/formaldehyde novolaks, cresol/formaldehyde novolaks and phenol-modified xylenol/formaldehyde novolaks.

Furthermore, polymers of vinylphenol or isopropenylphenol, and copolymers of said compounds with alkyl acrylates, alkyl methacrylates, styrene, etc., are suitable (cf. DE-A-No. 3,406,927).

The quantity of the binder may be varied in wide limits; in the case of low-molecular-weight o-quinone diazides, however, proportions of the binder from about 30% to 90% by weight are preferred, about 55% to 85% by weight being particularly preferred, based on the nonvolatile constituents. If polymer-bound o-quinone diazides are used, it is possible to dispense completely or partially with the binder; in that case, the binder content is preferably about 0 to 30% by weight, based on the nonvolatile constituents.

The equivalent ratio of o-quinone diazide to the phenolic hydroxyl groups of the binder is about 0.03 to 0.3, preferably about 0.06 to 0.2.

For the purpose of adaptation to specific requirements, additives such as plasticizers, for example polyvinyl ether (DE-A-No. 1,622,301) or hydrogenated colophonium resin (DE-A-No. 3,023,201) may also be added to the coatings. In addition, mention is made of adhesion promoters, pigments, dyestuffs, color formers and optionally UV absorbers. Triphenylmethane dyestuffs are particularly preferred as dyestuffs.

The bases which are normally used in reproduction techniques may be used for the photosensitive mixture. These are, for example, plates or foils composed of metal such as aluminum or zinc with an appropriately pretreated surface, multiple-metal plates, for example, composed of chromium/brass, chromium/copper/aluminum, chromium/copper/zinc, and also paper films, plastic films, fabrics suitable for screen printing, or metallized plates composed of insulating material. Preferred are aluminum sheets with appropriate pretreatment to improve the adhesion of the copying coating and to improve the hydrophilic nature of the base surface, for instance, mechanically, chemically or electrochemically roughened, optionally anodized aluminum bases post-treated with phosphonic acids, silicates or polyarylamides, etc.

The coating of the base material is carried out in a manner known per se. for example by applying by means of rollers or bars, by spraying on or casting. A suitable range for the dry coating weight is between about 1.0 and 3.0 g/m$^2$. Although lower coating quantities favor the photographic sensitivity, they have the disadvantage of a reduced film strength and a reduced print run level.

For exposure to light, use may be made of the usual light sources, such as carbon arc, pulsed xenon or metal-halide doped mercury vapor lamps. Image creation, in some cases without a mask, using laser beams, x-ray beams and electron beams is also possible.

After exposure to an image, the photosensitive copying materials are developed in the normal manner with aqueous alkaline solutions which may also contain smaller quantities of organic solvents or wetting agents. Said developers have, in general, a pH of about 10 to 14 and essentially contain alkali phosphates, silicates, borates and/or hydroxides, and also surfactants and optionally, in small quantities, organic solvents. The development can be carried out by immersing, brushing, spraying in suitable processing units or manually by wiping over or rubbing with a swab.

To increase the chemical and mechanical stability—for example for use in offset printing—the coatings may be heated for a short time after development to elevated temperatures (GB-A-No. 1,154,749). Such a post-curing has the advantage of possibly increasing the processing speed, or allowing the exposure to light to be carried out with lamps of lower power for the same processing speed.

The photosensitive mixtures according to the invention are preferably applied in the production of printing forms, in particular offset printing forms. This does not, however, restrict the use of the mixtures according to the invention in other photolithographic processes. Application in the field of photoresist is likewise possible.

The invention is explained in more detail on the basis of the examples below.

EXAMPLE 1

A coating solution was prepared which was composed of:

1.0 pbw of the esterification product of 1 mol of 2,3,4-trihydroxybenzo-phenone with 3 mol of 1,2-naphthoquinone-2-diazide-5-sulfonyl chloride, 5.2 pbw of a cresol/formaldehyde novolak having a softening point of 105°–120° C. by the DIN 53 181 capillary method, 0.7 pbw of 3-hydroxyacetylacetanilide, 0.1 pbw of 1,2-naphthoquinone-2-diazide-4-sulfonyl chloride, 0.05 pbw crystal violet (C.I. 42 555) in 5 pbw of 2-methoxyethanol, and 93 pbw of tetrahydrofuran.

The equivalent ratio of the 3-hydroxyacetylacetanilide coupler to the 1,2-naphthoquinone diazide was and that of the 1,2-naphthoquinone diazide to the phenolic hydroxyl groups in the binder was 0.075:1.

The coating solution was spun onto a 0.3 mm thick aluminum base which had been electrochemically roughened, anodized and rendered hydrophilic with polyvinylphosphonic acid, and was then dried at 100° C. for 1 minute. The coating weight was 2.3 g/m$^2$.

The offset printing plate produced in this manner was covered with a copying original which contained a continuous-tone wedge, microlines with a thickness of between 4 and 75 μm and screen dots with an area coverage of 0.5% to 5%. Exposure to an image was then carried out with a mercury high-pressure lamp (5,000 W) for 60 seconds. The offset printing plate was developed with an alkaline developer having the composition:

5.3 pbw of sodium metasilicate nonahydrate, 3.4 pbw of trisodium phosphate dodecahydrate, 0.3 pbw of sodium dihydrogen phosphate, 91 pbw of fully demineralized water.

After a development time of 1 minute, step 4 of the 13-step continuous-tone wedge had been uncovered by development, while step 10 was completely covered. The five steps consequently slightly exposed exhibited excellently reproduced fine structural elements; the coating was in satisfactory condition in the image areas. Even after a development time of 3 minutes it was not possible to detect any impairment of the outstanding resolution; the unexposed areas of the coating were therefore resistant towards the developer.

COMPARISON EXAMPLE 1

A coating solution was prepared which was composed of:

1.0 pbw of the esterification product of 1 mol of 2,3,4-trihydroxybenzophenone with 3 mol of 1,2-naphthoquinone-2-diazide-5-sulfonyl chloride, 5.0 pbw of a cresol/formaldehyde novolak with a softening point of 105°–120° C., 0.1 pbw of 1,2-naphthoquinone-2-diazide-4-sulfonyl chloride, 0.06 pbw of crystal violet (C.I. 42 555) in 5.0 pbw of 2-methoxyethanol, and 4 pbw of tetrahydrofuran.

The same base as in Example 1 was coated, exposed to an image and developed in the same manner as described there.

After a development time of 1 minute, step 3 of the 13-step continuous-tone wedge was not completely uncovered, while step 9 was still covered. The coating was therefore about a factor of 1.5 less photosensitive than that of Example 1.

COMPARISON EXAMPLE 2

A coating solution was prepared which was composed of:

1.0 pbw of the esterification product of 1 mol of 2,3,4-trihydroxybenzophenone with 3 mol of 1,2-naphthoquinone-2-diazide-5-sulfonyl chloride, 0.7 pbw of the condensation product of 2,3,4-trihydroxybenzophenone and formaldehyde described in EP-A-No. 0,010,749, Examples 1, 5 and 7, 5.0 pbw of a cresol/formaldehyde novolak having a softening point of 105°–120° C. according to the DIN 53 181 capillary method, 0.7 pbw of 3-hydroxyacetylacetanilide, 0.1 pbw of 1,2-naphthoquinone-2-diazide-4-sulfonyl chloride, 0.06 pbw of crystal violet (C.I. 42 555) in 5 pbw of 2-methoxyethanol, and 92 pbw of tetrahydrofuran.

The coating applied to aluminum was exposed to an image and developed as in Example 1. In the 13-step continuous-tone wedge, step 4 was uncovered, while step 12 was covered. The photosensitivity therefore corresponded to the coating in Example 1, but the gradation was two steps softer.

EXAMPLES 2 to 4

The examples correspond to the Example 1 with the exception that, instead of 0.7 part by weight of 3-hydroxyacetylacetanilide, equimolar proportions of the coupling reagents described below were used.

The plates were exposed for 30 seconds and developed with a developer composed of:

8.4 pbw of sodium metasilicate nonahydrate, 0.8 pbw of sodium hydroxide, 1.5 pbw of borax, and 89.3 pbw of fully demineralized water.

The coupling reagents, their proportions by weight in the coating and also the photosensitivity resulting from these coatings are summarized in Table 1.

TABLE-1

| Ex. | Coupling reagent | Amount added | Photosensitivity |
|---|---|---|---|
| 2 | Barbituric acid | 0.5 pbw | Steps 3–4, uncovered |
| 3 | Dimedone | 0.5 pbw | Steps 2–3, uncovered |
| 4 | 3-Methylpyrazol-5-one | 0.4 pbw | Steps 3–4, uncovered | pbw = part(s) by weight

COMPARISON EXAMPLE 3

Coating solutions were prepared as in Examples 2 to 4, with the exception that a coupling reagent was dispensed with. Coating, exposure to light and development again corresponded to the Examples 2 to 4. In the Comparison Example it was possible to uncover completely step 2 of the continuous-tone wedge by development. The photosensitivity is therefore less than that which it was possible to measure in the Examples 2 to 4.

EXAMPLES 5 to 7

A coating solution was prepared which was composed of:

1.5 pbw of the esterification product of 1 mol of 2,3,4-trihydroxybenzophenone with 3 mol of 1,2-naphthoquinone-2-diazide-5-sulfonyl chloride, 6 pbw of a cresol/formaldehyde novolak with a softening point of 105°–120° C. according to the DIN 53 181 capillary method, 0.2 pbw of 1,2-naphthoquinone-2-diazide-4-sulfonyl chloride, 0.07 pbw of crystal violet (C.I. 42 555) in 5 pbw of 2-methoxyethanol, and 92 pbw of tetrahydrofuran.

The coating solution furthermore contained in each case the coupling reagents summarized in Table 2.

The coating solution was applied to an aluminum base as in Example and the plates were exposed to an image and developed analogously to Example 2. The photosensitivity is between 4 and 5 steps (Table 2).

TABLE 2

| Ex. | Coupling reagent | Amount added | Photosensitivity |
|---|---|---|---|
| 5 | m-Bis-acetyl-acetaminobenzene | 0.7 pbw | Step 5 uncovered |
| 6 | Acetylacetanilide | 0.4 pbw | Step 4 uncovered |
| 7 | 4-Acetylacetamino-N-hydroxyethyl benzamide | 0.6 pbw | Step 4 uncovered | pbw = part(s) by weight

COMPARISON EXAMPLE 4

A coating solution was prepared as in the Examples 5 to 7, with the exception that a coupling reagent was dispensed with. Coating, exposure to light and development again corresponded to the Examples 5 to 7. In the comparison example it was possible to uncover step 2 of the continuous-tone wedge by development. The photosensitivity is therefore less than that which could be determined in the Examples 5 to 7.

EXAMPLE 8

A coating solution was prepared which was composed of:

5 pbw of a polymer-bound 1,2-naphthoquinone-2-diazide-5-sulfonic acid ester, the preparation of which is described below, 1 pbw of 1,3-bis-acetylacetaminobenzene, and 94 pbw of tetrahydrofuran.

The equivalent ratio of the 1,3-bis-acetylacetaminobenzene to the 1,2-naphthoquinonediazide was 1:1, and the ratio of 1,2-naphthoquinonediazide to the phenolic hydroxyl groups in the polymer was 0.25:1.

The coating solution was applied to an aluminum base in accordance with the data in Example 1, exposed to an image for 60 seconds and developed with a 3% sodium silicate solution for 1 minute. Step 3 of the 13-step continuous-tone wedge was uncovered by development; the screen dots and microlines were reproduced well.

PREPARATION OF THE POLYMER-BOUND 1.2-NAPHTHOQUINONEDIAZIDE-5-SULFONIC ACID ESTER 120 g of polyhydroxystyrene (manufactured by Maruzen Oil Company) were taken up in 1,000 ml of tetrahydrofuran, heated to 30° C. and 53.7 g of 1,2-naphthoquinone-2-diazide-5-sulfonyl chloride was dissolved in the solution while stirring. A pH of 10 was reached by adding a 10% aqueous potassium carbonate solution dropwise and stirring was continued for 30 minutes. The product was precipitated in ice water, dissolved in tetrahydrofuran in order to be re-precipitated again in ice water. After filtering off the product by suction, it was dried over $P_4O_{10}$ for 1 day in vacuo at room temperature. 20% of the phenolic hydroxyl groups were esterified in the product (determined by elementary analysis).

COMPARISON EXAMPLE 5

A coating solution was prepared which was composed of:

5 pbw of the polymer-bound 1,2-naphthoquinone-2-diazide-5-sulfonic acid ester from Example 8, and 95 pbw of tetrahydrofuran.

The equivalent ratio of 1,2-naphthoquinonediazide groups to the phenolic hydroxyl groups in the polymer was 0.25:1, as in Example 8.

The coating solution was applied to an aluminum base in accordance with the data in Example 1, exposed to an image for 60 seconds and developed, as in Example 8, for 1 minute with a 3% sodium silicate solution.

After evaluation of the continuous-tone wedge, it was possible to establish that the photosensitivity was a factor of 1.5 less than that of the Example 8.

EXAMPLES 9 to 12

The examples correspond to the Example 8, with the exception that, instead of 1 part by weight of 1,3-bis-acetylacetaminobenzene, equimolar proportions of the coupling reagents described below were used and that in this case, exposure to the image took place for 80 seconds.

The coupling reagents, their parts by weight in the coating and also the photosensitivity of the corresponding offset printing plates resulting with these reagents are summarized in Table 3. The screen dots and microlines were reproduced well.

TABLE 3

| Ex. | Coupling reagent | Amount added | Photosensitivity |
|---|---|---|---|
| 9 | Resorcin | 0.8 pbw | Step 4 uncovered |
| 10 | 2,4-Dihydroxy-N-hydroxyethyl-benzamide | 1.6 pbw | Step 4 uncovered |
| 11 | 3,5-Dihydroxy-N-hydroxyethyl-benzamide | 1.6 pbw | Step 5 uncovered |
| 12 | Resorcin monohydroxyethyl ether | 1.0 pbw | Step 4 uncovered | pbw = part(s) by weight

COMPARISON EXAMPLE 6

Coating solutions were prepared as in the Examples 9 to 12, with the exception that a coupling reagent was dispensed with. Coating, exposure to light and development again correspond to the Examples 9 to 12. The result was that a photosensitivity was found according to which step 3 of a 13-step continuous-tone wedge was uncovered by development. The photosensitivity in the Comparison Example is therefore less than in the Examples 9 to 12.

What is claimed is:

1. A positive-working photosensitive, mixture consisting essentially of:

about 10% to 30% by weight, based on the nonvolatile constituents of a photosensitive sulfonic acid ester of o-quinine diazide with an aromatic hydroxyl compound having a molecular weight of about 800 to 8,000 daltons, a polymeric water-insoluble binder which is soluble or at least swellable in aqueous-alkaline solutions in an amount sufficient to produce a uniform film, and a coupler compound which can form an azo coupling with the o-quinine diazide, wherein the coupler is a compound of the formula I $$(R_1)_n = Q-CH_2-\overset{O}{\underset{\|}{C}}-R_2 \qquad I$$

where
n = 1, Q = carbonyl, and
n = 0, Q = cyano, $R_1$, $R_2$ are identical or different and denote alkyl, cycloalkyl, alkoxy, alkyl-, aryl- or acylamino, alkoxycarbonylamido, heteroaryl or a heteroarylimino of the formula III

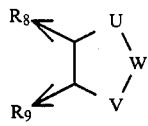

wherein

U,V,W are identical or different, and denote in each case one of the following groups: methylene, which may be unsubstituted or substituted by alkyl, aryl, phenyl, carboxyl, or carboxylamide; carbonyl, carbonylimino, sulfur, selenium, oxygen, amino, imino, which may be unsubstituted or substituted by alkyl or aryl; and $R_8$ and $R_9$ are identical or different and denote hydrogen or alkyl wherein the equivalent ratio of coupler to o-quinine diazide compound is about 0.5 to 3.

2. A photosensitive mixture as claimed in claim 1, wherein the equivalent ratio of coupler to o-quinine diazide is about 0.8 to 2.

3. A photosensitive mixture as claimed in claim 1, wherein the mixture contains a solvent.

4. A photosensitive mixture as claimed in claim 1, wherein the photosensitive mixture comprises 1,2-naphthoquinine-2-diazide-4-sulfonyl chloride and a dyestuff.

5. A photosensitive mixture as claimed in claim 1, wherein the content of binder is about 30% to 90% by weight, based on the nonvolatile constituents.

6. A photosensitive mixture as claimed in claim 1, wherein the binder comprises phenolic hydroxy groups and the equivalent ratio of o-quinine diazide to the phenolic hydroxyl groups is about 0.03 to 0.3.

7. A photosensitive copying material comprising:
a substrate; and
a photosensitive coating comprising a photosensitive mixture as claimed in claim 1.

* * * * *